(12) United States Patent
Arvin et al.

(10) Patent No.: US 10,586,782 B2
(45) Date of Patent: Mar. 10, 2020

(54) LEAD-FREE SOLDER JOINING OF ELECTRONIC STRUCTURES

(71) Applicant: International Business Machines Corporation, Armonk, NY (US)

(72) Inventors: Charles L. Arvin, Poughkeepsie, NY (US); Clement J. Fortin, Quebec (CA); Christopher D. Muzzy, Burlington, VT (US); Brian W. Quinlan, Poughkeepsie, NY (US); Thomas A. Wassick, Lagrangeville, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/640,475

(22) Filed: Jul. 1, 2017

(65) Prior Publication Data
US 2019/0006312 A1 Jan. 3, 2019

(51) Int. Cl.
*H01L 23/00* (2006.01)
*H01L 23/498* (2006.01)

(52) U.S. Cl.
CPC ........ *H01L 24/81* (2013.01); *H01L 23/49811* (2013.01); *H01L 23/49894* (2013.01); *H01L 24/03* (2013.01); *H01L 24/11* (2013.01); *H01L 24/13* (2013.01); *H01L 23/49816* (2013.01); *H01L 24/05* (2013.01); *H01L 24/16* (2013.01); *H01L 2224/03318* (2013.01); *H01L 2224/03849* (2013.01); *H01L 2224/0401* (2013.01); *H01L 2224/05073* (2013.01);
(Continued)

(58) Field of Classification Search
None
See application file for complete search history.

(56) References Cited

U.S. PATENT DOCUMENTS

| | | | |
|---|---|---|---|
| 6,204,558 B1 | 3/2001 | Yanagida | |
| 6,429,388 B1 * | 8/2002 | Interrante | B23K 35/262 |
| | | | 174/261 |

(Continued)

FOREIGN PATENT DOCUMENTS

| | | |
|---|---|---|
| JP | 2012199494 A | 10/2012 |
| JP | 5630060 B2 | 11/2014 |
| JP | 2015192130 A | 11/2015 |
| WO | 2017034589 A1 | 3/2017 |

OTHER PUBLICATIONS

S.K.Kang et al., "Microstructure and mechanical properties of lead-free solders and solder joints used in microelectronic applications", IBM Journal of Research and Development, vol. 49, No. 4-5, 2005, pp. 607-620.

*Primary Examiner* — William A Harriston
(74) *Attorney, Agent, or Firm* — Law Offices of Ira D. Blecker, P.C.

(57) ABSTRACT

A method and structure for joining a semiconductor device and a laminate substrate or two laminate substrates where the joint is formed with lead free solders and lead free compositions. The various lead free solders and lead free compositions are chosen so that there is a sufficient difference in liquidus temperatures such that some components may be joined to, or removed from, the laminate substrate without disturbing other components on the laminate substrate.

25 Claims, 8 Drawing Sheets

(52) U.S. Cl.
CPC ............... *H01L 2224/05144* (2013.01); *H01L 2224/05147* (2013.01); *H01L 2224/05155* (2013.01); *H01L 2224/05552* (2013.01); *H01L 2224/05568* (2013.01); *H01L 2224/05573* (2013.01); *H01L 2224/05647* (2013.01); *H01L 2224/05655* (2013.01); *H01L 2224/11334* (2013.01); *H01L 2224/11849* (2013.01); *H01L 2224/13111* (2013.01); *H01L 2224/13139* (2013.01); *H01L 2224/13147* (2013.01); *H01L 2224/13155* (2013.01); *H01L 2224/16012* (2013.01); *H01L 2224/16058* (2013.01); *H01L 2224/16227* (2013.01); *H01L 2224/16237* (2013.01); *H01L 2224/16501* (2013.01); *H01L 2224/81191* (2013.01); *H01L 2224/81385* (2013.01); *H01L 2224/81815* (2013.01); *H01L 2924/014* (2013.01); *H01L 2924/0132* (2013.01); *H01L 2924/0135* (2013.01); *H01L 2924/20102* (2013.01); *H01L 2924/20103* (2013.01); *H01L 2924/20104* (2013.01); *H01L 2924/20105* (2013.01); *H01L 2924/20106* (2013.01); *H01L 2924/20107* (2013.01)

(56) References Cited

U.S. PATENT DOCUMENTS

| | | | |
|---|---|---|---|
| 6,872,465 | B2 | 3/2005 | Soga et al. |
| 7,259,465 | B2 | 8/2007 | Soga et al. |
| 7,838,954 | B2 | 11/2010 | Buchwalter et al. |
| 7,897,515 | B2 | 3/2011 | Zhu |
| 7,960,831 | B2 | 6/2011 | Hua et al. |
| 8,191,757 | B2 | 6/2012 | Lewis et al. |
| 8,828,860 | B2 | 9/2014 | Gruber et al. |
| 8,980,739 | B2 | 3/2015 | Cho et al. |
| 9,412,715 | B2 | 8/2016 | Shimizu et al. |
| 9,515,044 | B1 | 12/2016 | Sekine |
| 9,615,464 | B2 | 4/2017 | Kubota et al. |
| 2004/0007384 | A1 | 1/2004 | Soga et al. |
| 2009/0197114 | A1 | 8/2009 | Shih et al. |
| 2010/0326726 | A1 | 12/2010 | Tanaka et al. |
| 2013/0001782 | A1 | 1/2013 | Otsuka et al. |
| 2014/0151096 | A1 | 6/2014 | Jiang et al. |
| 2017/0053858 | A1* | 2/2017 | Krajniak ........... H01L 23/49833 |

* cited by examiner

LEAD-FREE SOLDER JOINING OF ELECTRONIC STRUCTURES

BACKGROUND

The present exemplary embodiments pertain to the joining of electronic structures such as semiconductor devices to a laminate substrate and, in turn, the laminate substrate to other laminate substrates.

First, second and third level packages require the joining of multiple components onto the substrate. The first level package may be a chip scale package (CSP) to receive a semiconductor device, also referred to as a chip. The second level package may be a daughter card onto which one or more CSPs may be joined. The third level package may be a mother card (also known as a mother board) onto which one or more daughter cards may be joined.

There is a need to reduce the thermal exposure with each attachment of a component to a substrate and to avoid having the joints of the earlier joined components remelted to the point they move. If the earlier joined components move, the movement can lead to potential issues such as chip package interactions defects, solder extrusion, solder spitting, etc.

During the leaded period of microelectronics, it was possible to have joints made with high melt temperature leaded solder and low melt temperature leaded solder.

The introduction of lead free solders has brought a number of challenges with respect to the joining of multiple components on multiple levels of packages. The concept of having a high melt temperature solder joined to a low melt temperature solder was not pursued mainly due to a reduced delta in the melting point of the different lead free solders and their availability to have controlled plating on the chip side and availability of options on the substrate side.

BRIEF SUMMARY

The various advantages and purposes of the exemplary embodiments as described above and hereafter are achieved by providing, according to an aspect of the exemplary embodiments, a method of joining a semiconductor structure comprising: forming a first low melting temperature lead free solder having a liquidus temperature less than 230° C. on a first substrate; placing a lead free ball comprising copper and tin having a liquidus temperature greater than 250° C. on the first low melting temperature lead free solder; reflowing the first low melting temperature lead free solder at a temperature lower than the liquidus temperature of the lead free ball; annealing at a temperature of 140 to 165° C. to convert the first low melting temperature lead free solder into a higher melting temperature lead free solder having a liquidus temperature of 240 to 250° C.; placing a second low melting temperature lead free solder having a liquidus temperature of 220° C. or less on a second substrate; placing the lead free ball in direct contact with the second low melting temperature lead free solder; and heating at 240 to 260° C. the semiconductor structure to cause the second low melting temperature lead free solder to reflow and join with the lead free ball.

According to another aspect of the exemplary embodiments, there is provided a semiconductor structure comprising: a first substrate; a second substrate; a lead free ball comprising copper and tin having a liquidus temperature greater than 250° C. interposed between the first and second substrates; a high melt lead free solder joining the lead free ball to the first substrate, the high melt lead free solder having a liquidus temperature at least 10° C. less than the liquidus temperature of the lead free ball; a low melt lead free solder joining the lead free ball to the second substrate, the low melt lead free solder having a liquidus temperature of 220° C. or less.

According to another aspect of the exemplary embodiments, there is provided a method of joining a semiconductor structure comprising: forming an underbump metallurgy comprising a metal on a semiconductor device; forming lead free solder on the underbump metallurgy, the lead free solder comprising an alloy of tin and bismuth of the composition at least 85 weight percent bismuth, remainder tin; reflowing the lead free solder at 240-260° C. so that the lead free solder reflows to form solder bumps and react with the underbump metallurgy to raise the liquidus temperature of the solder bumps by incorporating the metal from the underbump metallurgy; forming pads of a low melting temperature lead free solder on a substrate, the solder comprising an alloy of tin, bismuth and silver with the composition 56-58 weight percent bismuth, 0.5-1.5 weight percent silver, remainder tin; and joining the reflowed bumps to the pads of solder at 200 to 230° C.

According to another aspect of the exemplary embodiments, there is provided a semiconductor structure comprising: a semiconductor device having an underbump metallurgy comprising a metal; a plurality of lead free solder bumps on, and alloyed with, the underbump metallurgy, the lead free solder bumps comprising an alloy of tin, bismuth and the metal from the underbump metallurgy, the plurality of solder bumps having a liquidus temperature of at least 260° C.; a substrate for receiving the semiconductor device; and lead free solder pads for joining the lead free solder bumps to the substrate, the lead free solder pads comprising tin, bismuth and silver and having a maximum liquidus temperature that is at least 10° C. less than the liquidus temperature of the lead free solder bumps.

According to a further aspect of the exemplary embodiments, there is provided a method of joining a semiconductor structure comprising: forming a lead free solder ball having a liquidus temperature less than 230° C. on a first substrate; forming a low melting temperature lead free solder having a liquidus temperature of 230° C. or less; alloying the low melting temperature lead free solder with an underball metallurgy on a second substrate, the alloying causing the liquidus temperature of the low melting temperature lead free solder to rise to 250 to 295° C. to form a high melting temperature lead free solder pad; coining the high melting temperature lead free solder pad to form a pattern of dimples on a top of the high melting temperature lead free solder pad; placing the lead free solder ball in direct contact with the pattern of dimples in the high melting temperature lead free solder pad; heating at 240 to 260° C. the lead free solder ball and the high melting temperature lead free solder pad to cause the lead free solder ball and the high melting temperature lead free solder pad to join.

According to yet another aspect of the exemplary embodiments, there is provided a semiconductor structure comprising: a first substrate; a second substrate having underball metallurgy; a lead free solder ball having a liquidus temperature less than 230° C. on the first substrate; and a high melting temperature lead free solder pad on the underball metallurgy on the second substrate joining the lead free solder ball to the second substrate, the high melting temperature lead free solder pad having a liquidus temperature of 250 to 295° C., the high melting temperature lead free solder pad having a pattern of dimples on a top surface of the high melting temperature lead free solder pad that make direct contact with the lead free solder ball.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 2A to 2C are cross sectional views to illustrate the exemplary method of FIG. 1 wherein:

FIG. 2A depicts a high melting temperature lead free ball joined to a first substrate by a low melting temperature lead free solder;

FIG. 2B depicts the low melting temperature lead free solder that has been reflowed to be a high melting temperature solder and a second substrate having a low melting temperature lead free solder; and FIG. 2C depicts the joining of the high melting temperature lead free ball to the low melting temperature lead free solder on the second substrate.

FIGS. 4A to 4D are cross sectional views to illustrate the exemplary method of FIG. 3 wherein:

FIG. 4A depicts lead free solder on underbump metallurgy on a semiconductor device;

FIG. 4B depicts the reflow of the lead free solder to form a lead free solder bump which has alloyed with the underbump metallurgy to increase its melting temperature;

FIG. 4C depicts the formation of low melting temperature solder on a first level package; and FIG. 4D depicts the joining of the lead free solder bump to the low melting temperature solder on the first level package.

FIGS. 6A to 6D are cross sectional views to illustrate the exemplary method of FIG. 5 wherein:

FIG. 6A depicts the formation of a low melting temperature lead free solder bump on a first substrate;

FIG. 6B depicts the formation of a high melting temperature lead free solder pad alloyed with underbump metallurgy on a second substrate;

FIG. 6C depicts the coining of the high melting temperature lead free solder pad to form dimples on a surface of the high melting temperature lead free solder pad; and FIG. 6D depicts the joining of the low melting temperature lead free solder bump on the first substrate with the high melting temperature lead free solder pad on the second substrate and the dimpled interface between the low melting temperature lead free solder bump and the high melting temperature lead free solder pad.

DETAILED DESCRIPTION

Figure 1:
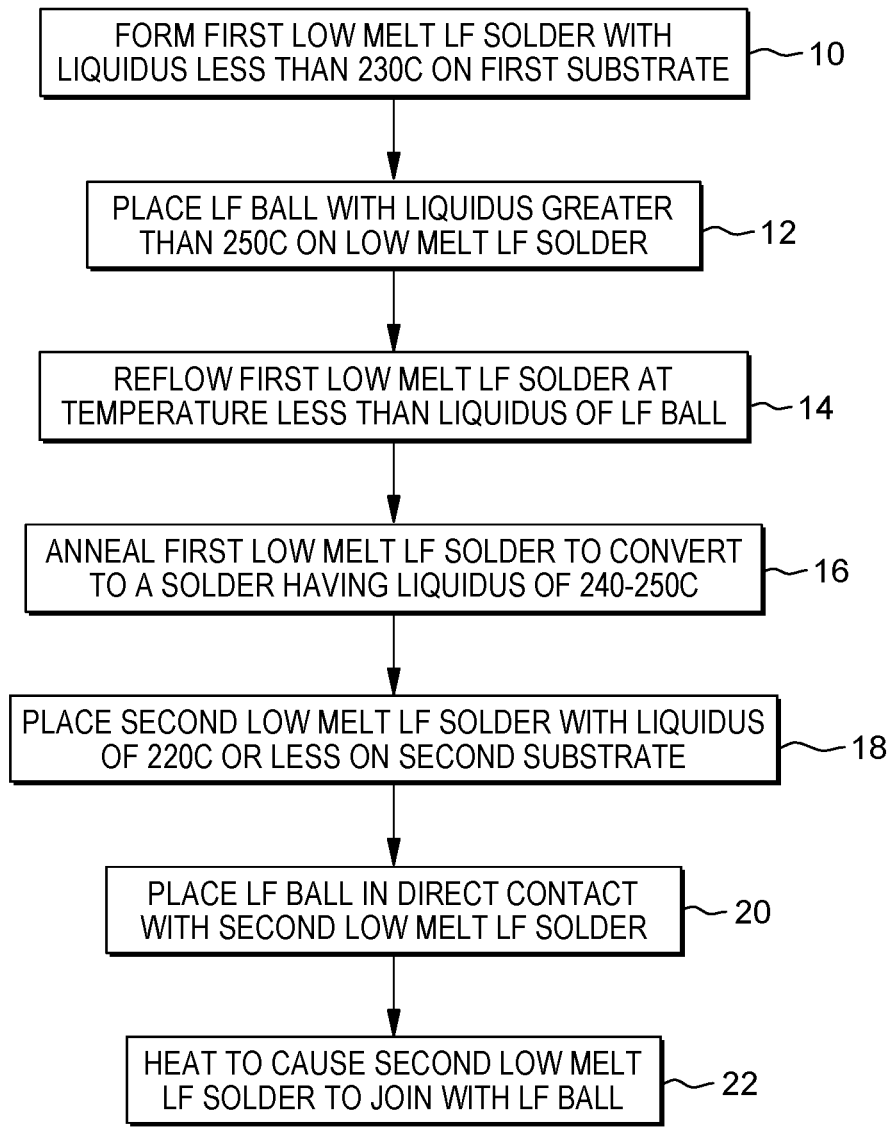
FIG. 1 is a flow chart for an exemplary method of joining a first substrate to a second substrate in which a high melting temperature lead free ball is joined to opposing substrates by lead free solders.

The following definitions for melting point, liquidus, solidus and organic laminate substrate are used herein. Elements have a melting point above which the element is liquid and below which is solid.

Alloys may be illustrated by a phase diagram. In a simple two element alloy system, such as a eutectic system, the alloy may have a eutectic point (similar to a melting point) above which the element is liquid and below which is solid. More often, the alloy may have two phase regions which may be defined by an upper boundary, called the liquidus, and a lower boundary, called the solidus. Above the liquidus, the alloy is completely liquid. The liquidus thus denotes for each possible alloy composition in the two phase region the temperature at which freezing begins during cooling or at which melting is completed upon heating. The solidus indicates for each possible alloy composition in the two phase region the temperature at which melting begins upon heating or at which freezing is completed upon cooling. Below the solidus, the alloy is completely solid. Between the solidus and liquidus, liquid and solid phases are both present.

An organic laminate substrate may have a core of, for example, glass particle filled epoxy and may further have a top metallic plane and a bottom metallic plane.

As noted previously, multiple components need to be joined to various substrates at different times. A corollary is that components and the substrates may need to be reworked because of components that may have failed during testing. Reworking requires control of solder on the components and substrates so reworking may be accomplished without affecting every other component.

Further, it is desired to have a known mass of solder on every ball grid array of a substrate when it is removed. In this way, it is possible to avoid the need to remove solder from the laminate to which the ball grid array is attached and to add solder to the ball grid array.

Moreover, copper sphere (hereafter copper ball) stand offs may be used in the ball grid array. However, the copper balls can lead to a focusing of the current and have the potential to reduce electromigration performance.

Accordingly, it is proposed to change from a copper ball to either A) a Cu6Sn5 or Cu3Sn ball (liquidus >700° C.), or B) an SnAgCuNiAu alloy ball (liquidus about 250 to 280° C.) comprising (in weight percent) 0.1 to 6% copper, 0.1 to 4% silver, 0.1 to 1% gold, 0.1 to 2% nickel, balance tin.

The lower conductivity of these balls will make the electrical resistivity of the joint higher. Since the current comes in through the via, this will force the current from the center toward the edge of the joint. Due to the higher melting point and the higher activation energy to move an atom out of the matrix of the intermetallic vs. the solder, the electromigration performance is now enhanced.

The limiting of the pre-solder on whichever side the ball is placed leads to that side becoming alloyed with the ball. Upon melting during rework, the side with the sphere maintains all of the solder and ball. The side without the ball melts leading to about half of the solder going with the ball and half remaining on the other side.

Referring to the Figures in more detail, and particularly referring to FIGS. 1 and 2, there is illustrated an exemplary embodiment of a method of joining a semiconductor structure and the semiconductor structure.

The method includes forming a first low melting temperature lead free solder having a liquidus temperature less than 230° C. on a first substrate, box 10 and then placing a lead free ball having a liquidus temperature equal to or greater than 250° C. on the first low melting temperature lead free solder, box 12 (FIG. 1). The lead free ball may have a composition comprising copper and tin (Cu6Sn5 or Cu3Sn (liquidus >700° C.)), or a tin/silver/copper/nickel/gold (SnAgCuNiAu) alloy (liquidus about 250 to 280° C.).

Figure 2A:
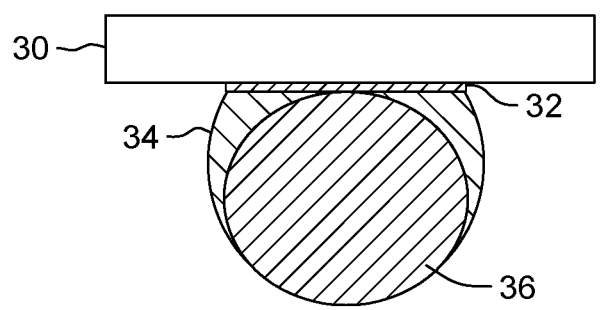

Referring to FIG. 2A, first substrate 30 has an underbump metallurgy (UBM) pad 32 of copper or nickel. First low melting temperature lead free solder 34 has been formed on the UBM pad 32. The first low melting temperature lead free solder 34 may be a tin/silver/copper (SAC) alloy having a liquidus temperature less than about 230° C. One example of a suitable SAC alloy may be SAC 105 having a composition of 1 weight percent silver, 0.5 weight percent copper, remainder tin and having a liquidus temperature of 227° C. The lead free ball 36 is placed on the first low melting temperature lead free solder 34.

The substrate 30 with the first low melting temperature lead free solder 34 and lead free ball 36 undergoes a heating step, typically 1-3 minutes to reflow the first low melting temperature lead free solder 34 at a temperature less than the liquidus of the lead free ball 36, box 14 (FIG. 1). For example, this temperature may be at a typical chip join temperature of 240 to 260° C.

The reflowing is followed by annealing at a temperature of around 150° C., typically for 60 to 300 minutes depending on an annealing temperature of 140 to 165° C., with the shorter annealing times corresponding to the higher annealing temperatures, to convert the first low melting temperature lead free solder 34 into a higher melting temperature lead free solder having a liquidus temperature of 240 to 250° C., box 16 (FIG. 1). The first low melting temperature lead free solder 34 is chosen so that after annealing, there is at least a 10° C. liquidus temperature difference between the higher melting temperature lead free solder 38 and the lead free ball 36 with the lead free ball 36 having the higher liquidus temperature.

Figure 2B:
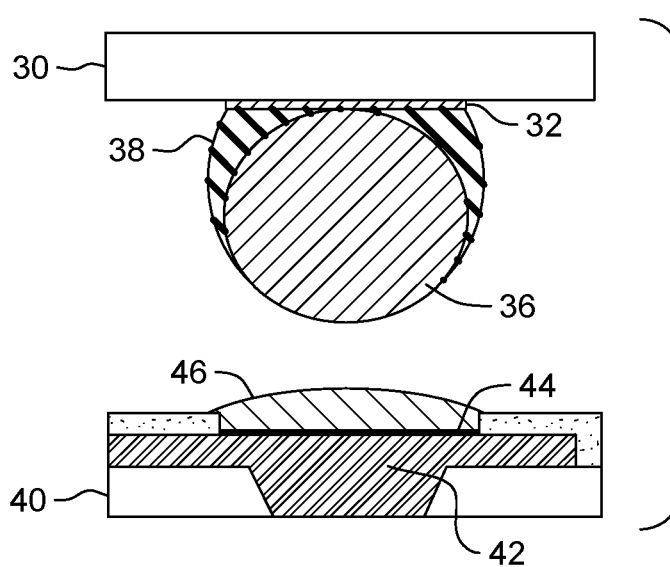

Referring now to FIG. 2B, the reflowed first low melting temperature lead free solder is now shown as a higher melting temperature lead free solder 38 joining the lead free ball 36. As a result of the reflowing and annealing steps, the first low melting temperature lead free solder 34 alloys with the lead free ball 36 to form a higher melting temperature lead free solder 38 to lock the lead free ball 36 in place. At this point, the higher melting temperature lead free solder 38 may have a liquidus temperature of 240 to 250° C. Again, the liquidus temperature of higher melting temperature lead free solder 38 should be at least 10° C. less than the liquidus temperature of the lead free ball 36.

Also shown in FIG. 2B and described in box 18 (FIG. 1) is second substrate 40 having wiring 42, for example copper wiring, UBM pad 44 and a second low melting temperature lead free solder 46. The second low melting temperature lead free solder 46 may also be a SAC alloy having a liquidus of 220° C. or less. One example of a suitable SAC alloy may be SAC 405 having a composition of 4 weight percent silver, 0.5 weight percent copper, remainder tin and having a liquidus temperature of 220° C.

The lead free ball 36 is placed in direct contact with the second low melting temperature lead free solder 46, box 20 (FIG. 1) and then heated at 240 to 260° C. for typically 1 to 3 minutes to cause the second low melting temperature lead free solder 46 to reflow and join with the lead free ball 36, box 22 (FIG. 1). The joining temperature is adjusted so as to be less than the liquidus temperatures of the higher melting temperature lead free solder 38 and the lead free ball 36.

Figure 2C:
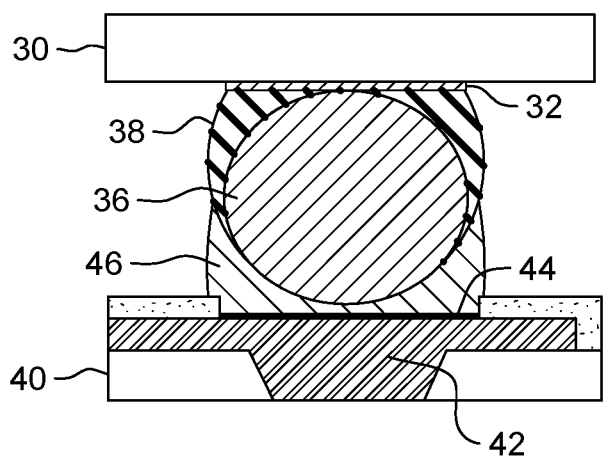

Referring now to FIG. 2C, the lead free ball 36 has been placed into contact with the second low melting temperature lead free solder 46 and heated at 240 to 250° C. to join the lead free ball 36 to the second low melting temperature lead free solder 46 which in turn joins first substrate 30 to second substrate 40.

In one exemplary embodiment, the first substrate 30 is a first level package such as a chip scale package and the second substrate 40 is an organic laminate daughter card.

In another exemplary embodiment, the first substrate 30 is an organic laminate daughter card and the second substrate 40 is a first level package such as a chip scale package.

In a further exemplary embodiment, the first substrate 30 is an organic laminate daughter card and the second substrate 40 is an organic laminate mother card.

In yet another exemplary embodiment, the first substrate 30 is an organic laminate mother card and the second substrate 40 is an organic laminate daughter card.

FIG. 2C illustrates a semiconductor structure which may include a first substrate 30 and a second substrate 40. Interposed between the first and second substrates 30, 40 may be a lead free ball 36 having a liquidus temperature equal to or greater than 250° C. The lead free ball 36 comprises at least copper and tin and may include the alloys previously mentioned. There is a high melt lead free solder 38 joining the lead free ball 36 to the first substrate 30. The high melt lead free solder 38 has a liquidus temperature at least 10° C. less than the liquidus temperature of the lead free ball 36. The semiconductor structure further includes a low melt lead free solder 46 joining the lead free ball 36 to the second substrate 40. The low melt lead free solder has a liquidus temperature of 220° C. or less.

During reworking of the exemplary embodiments, the first substrate 30 having the higher melting temperature lead free solder 38 and the lead free ball 36 may be separated from the second substrate 40 with all of the higher melting temperature lead free solder 38 and the lead free ball 36 remaining with the first substrate 30. Some portion, approximately half, of the second low melting temperature lead free solder 46 will remain attached to the lead free ball 36, making reworking simpler.

Tin/bismuth (Sn/Bi) are proposed for joining a semiconductor device to a first level package, such as a CSP. The problem with tin/bismuth alloys is that they are stiff which has led to raised stress at the joint between the semiconductor device and the first level package.

In an exemplary embodiment, it is proposed to use two different tin/bismuth alloys to create a joint with low stress during chip join. One tin/bismuth alloy is 85 weight percent or more of bismuth, remainder tin. The tin/bismuth alloy is used to form solder balls on a semiconductor device. A tin/bismuth/silver alloy is placed on the first level package to enable joining of the semiconductor device to the first level package. Only enough mass of the tin/bismuth/silver alloy is used to enable joining but will be consumed during low temperature anneal. The tin/bismuth/silver alloy may comprise about 5 to 10% weight percent of the final solder joint mass. After joining, the joined components may be underfilled. If needed, a low temperature anneal at about 150° C., for example in the range of 140 to 165° C., may be used to fully consume the tin/bismuth/silver alloy into the solder joint.

Figure 3:
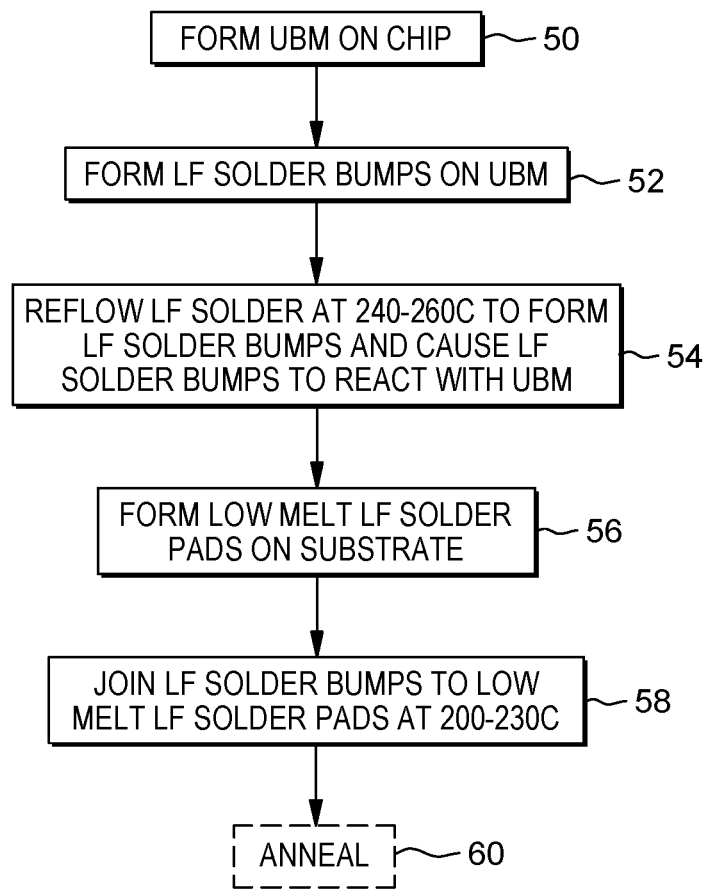
FIG. 3 is a flow chart for an exemplary method of joining a semiconductor device to a first level package.

Referring to the Figures in more detail, and particularly referring to FIGS. 3 and 4, there is illustrated an exemplary embodiment of a method of joining a semiconductor structure and the first level package.

The method includes forming an UBM metallurgy comprising a metal on a semiconductor device, box 50 (FIG. 3) followed by forming lead free solder on the underbump metallurgy, box 52 (FIG. 3). The lead free solder may comprise an alloy of tin and bismuth of the composition at least 85 weight percent bismuth, remainder tin.

Figure 4A:
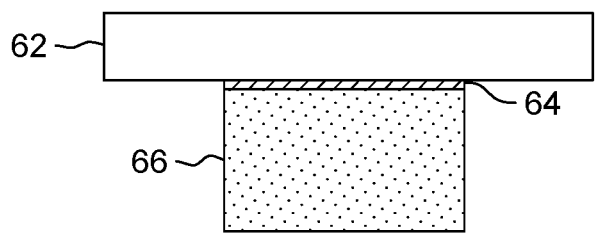

Referring now to FIG. 4A, there is depicted a semiconductor device 62 having UBM 64 and lead free solder 66. The UBM 64 may be plated and may comprise nickel or copper. The lead free solder 66 may, for example, be screened onto the UBM 64.

The lead free solder may be reflowed at 240-260° C. for typically 1 to 3 minutes so that the lead free solder reflows to form solder bumps and react with the UBM to raise the liquidus temperature of the solder bumps by incorporating the metal from the underbump metallurgy, box 54 (FIG. 3).

Figure 4B:
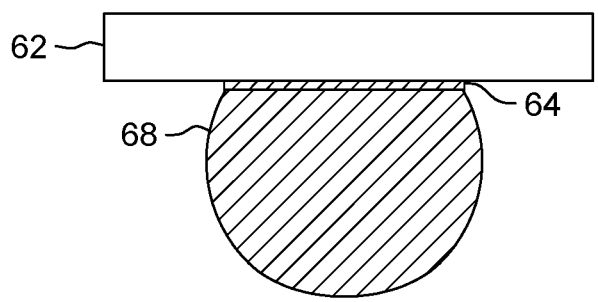

Referring now to FIG. 4B, the lead free solder 66 has been reflowed to form solder bumps 68. The lead free solder 66 reacts with the UBM 64 to incorporate nickel or copper from the UBM 64 which substantially raises the liquidus temperature of the solder bumps from below 250° C. to over 260° C.

Pads of a low melting temperature lead free solder are formed on a first level package substrate, such as a chip scale package. The low melting solder may comprise an alloy of tin, bismuth and silver. The tin/bismuth/silver alloy may have the composition, in weight percent, 56-58% bismuth, 0.5-1.5% silver, remainder tin and having a liquidus temperature of about 204° C., box 56 (FIG. 3).

Figure 4C:
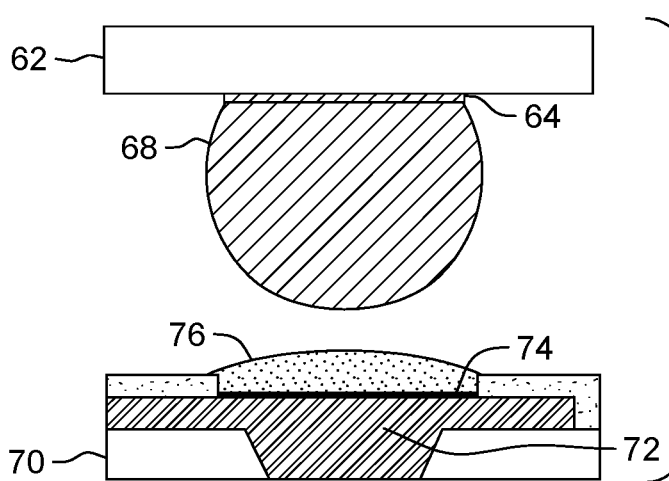

Referring now to FIG. 4C, semiconductor device 62 having solder bumps 68 is shown. Additionally shown is first level package substrate 70 having wiring 72, copper for example, terminal metallurgy 74 and low melting tin/bismuth/silver alloy solder 76.

The solder bumps are joined to the pads of lead free low melting solder at about 200-230° C., for example 215° C., box 58.

Figure 4D:
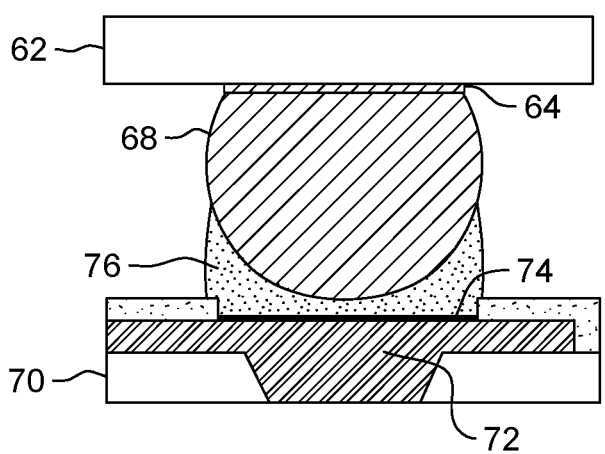

Referring now to FIG. 4D, the solder bump 68 is placed into direct contact with the pad 76 of lead free low melting solder and then heated to about 215° C. to reflow the lead free low melting solder pad 76 and join the lead free low melting solder pad 76 with the solder bump 68.

If needed, the semiconductor structure comprising the semiconductor device 62, solder bumps 68, first level package 70 and the lead free low melting solder pad 76 may be annealed at about 150° C., for example, 140 to 165° C., for about 60 to 300 minutes depending on temperature to fully consume the lead free low melting solder. That is, the lead free low melting solder pad 76 becomes alloyed with the solder bump 68 so that it is no longer just a tin/bismuth/silver alloy and may come closer in composition to the composition of the solder bump 68.

FIG. 4D illustrates a semiconductor structure which may include a semiconductor device 62 having an UBM 64 comprising a metal. Also included may be a plurality of lead free solder bumps 68 on, and alloyed with, the UBM 64. The lead free solder bumps 68 may comprise an alloy of tin, bismuth and the metal from the UBM 64. In one exemplary embodiment, the UBM 64 may be copper or nickel so that the metal included in the solder bumps 68 may be the copper or nickel. The plurality of solder bumps 68 have a liquidus temperature of at least 260° C.

The semiconductor structure further includes a substrate 70 for receiving the semiconductor device 62. The substrate 70 is a first level package and may be a CSP.

The semiconductor structure further includes lead free solder pads 76 for joining the lead free solder bumps 68 to the substrate 70. The lead free solder pads comprising tin, bismuth and silver and having a maximum liquidus temperature that is at least 10° C. less than the liquidus temperature of the lead free solder bumps.

Laminates typically do not have a copper pillar, pedestal or electrolytic nickel terminal metallurgy and as such they may have a lower electromigration performance for power and ground connections as compared to the semiconductor side which may have a combination of all of these. The semiconductor side may have solder bumps, socall C4 connections, for connecting to the first level package.

Electromigration performance is impacted both by the local current density at the solder interface and by the melting point of the solder itself.

It is proposed to utilize a high melting point solder on the laminate that forms initially at a low temperature. In this way, the laminate/solder interface will have a high melting point solder which improves the electromigration performance by about 50 mA/C4 connection.

Electromigration considerations are important for power and ground connections due to their higher current density. Signal connections, having a lower current density, are less affected by electromigration. Accordingly, in one exemplary embodiments, it is proposed to modify the laminate connections for power and ground connections.

Figure 5:
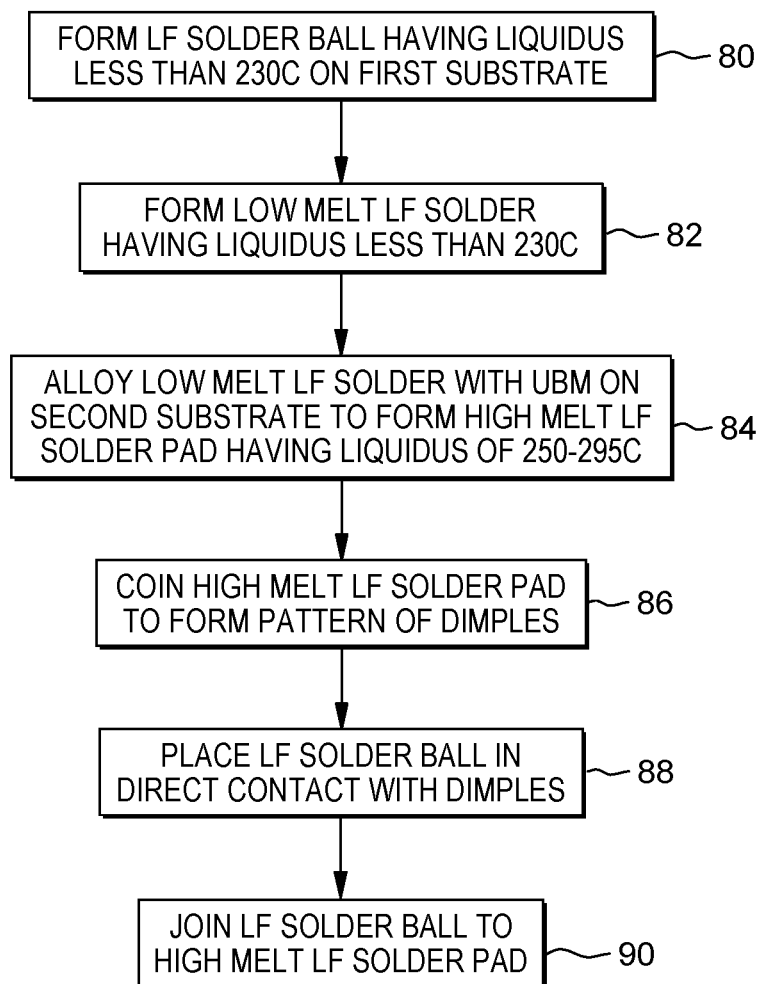
FIG. 5 is a flow chart for an exemplary method of joining a first substrate to a second substrate having a dimpled interface.

Referring to the Figures in more detail, and particularly referring to FIGS. 5 and 6, there is illustrated an exemplary embodiment of a method of joining a semiconductor structure and the semiconductor structure.

The method includes forming a lead free solder ball having a liquidus temperature less than 230° C. on a first substrate, box 80 (FIG. 5).

Figure 6A:
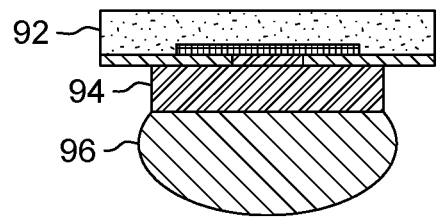

Referring now to FIG. 6A, there is shown a first substrate 92 having UBM 94 and a lead free solder ball 96. The lead free solder ball 96 has a liquidus temperature less than 230° C. The UBM 94 may be copper or nickel. For purposes of illustration and not limitation, the lead free solder ball 96 may comprise any tin/silver/copper alloy, such as SAC 105 or SAC 405 mentioned previously, so long as the liquidus temperature is less than 230° C.

The method further includes forming a low melting temperature lead free solder having a liquidus temperature of 230° C. or less, box 82 (FIG. 5) and alloying the low melting temperature lead free solder with an underball metallurgy on a second substrate, the alloying causing the liquidus temperature of the low melting temperature lead free solder to rise to about 250 to 295° C. to form a high melting temperature lead free solder pad, box 84 (FIG. 5).

Figure 6B:
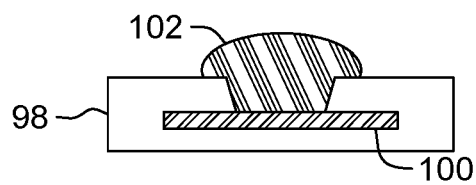

Referring now to FIG. 6B, there is shown a second substrate 98 having UBM 100 and the high melting temperature lead free solder pad 102.

The high melting temperature lead free solder pad 102 may be formed according to two methods. In one method, the low melting temperature lead free solder may be screened as solder paste onto UBM 100 and then reflowed above its liquidus temperature of about 230° C. to remove any organic materials in the solder paste. The reflow also pulls in the terminal metal to raise the liquidus temperature to about 250 to 295° C. In this method, low melting temperature lead free solder may be transformed to high melting temperature lead free solder pads 102.

In a second method, droplets of molten low melting temperature lead free solder may be dropped onto UBM 100 which then react with the UBM 100 to form the high melting temperature lead free solder pads 102.

The starting low melting temperature lead free solder may comprise an alloy of tin and one or more of bismuth, gold, silver, copper and nickel. The table below illustrates some exemplary embodiments of low melting temperature lead free solders and the preferred UBM for each solder.

| UBM | Solder Composition |
|---|---|
| Nickel | SnBi: >85 weight % Bi, remainder Sn |
| Nickel | SnAu: 1-2 weight % Au, remainder Sn |
| Nickel | SnAuCuAg: 0.5-1 weight % Au, 0.5-1 weight % Cu, 1-6 weight % Ag, remainder Sn |
| Nickel + Au coating | SnAgCuNi: 1-6 weight % Ag, 0.5-1 weight % Cu, 0.2 weight % Ni, remainder Sn |
| Nickel + Au coating | SnBi: >85 weight % Bi, remainder Sn |
| Copper | SnAgCuNiAu: 1-6 weight % Ag, 0.5-1 weight % Cu, 0.2 weight % Ni, 0.5-1 weight % Au, remainder Sn |
| Copper | SnBi: >90 weight % Bi, remainder Sn |
| Copper | SnAuNi: 1-2 weight % Au, 0.2 weight % Ni, remainder Sn |

The method further includes coining the high melting temperature lead free solder pad to form a pattern of dimples on a top of the high melting temperature lead free solder pad, box 86 (FIG. 5).

Figure 6C:
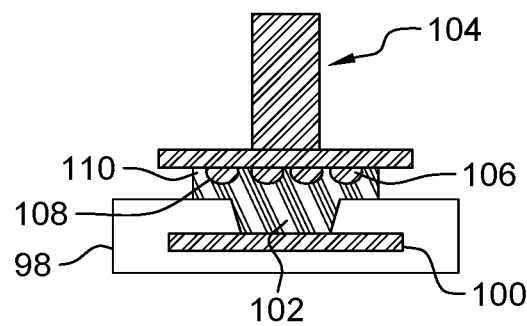
Figure 7:
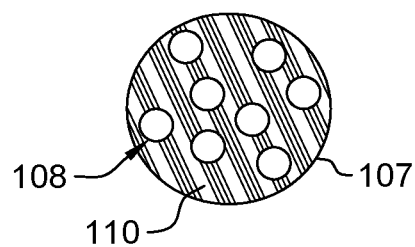
FIG. 7 is a plan view of the dimples in the high melting temperature lead free solder pad as a result of coining.

Referring now to FIG. 6C, coining apparatus 104 having projections 106 presses down on the high melting temperature lead free solder pad 102 to form a pattern of dimples (or depressions) 108 on a top 110 of the high melting temperature lead free solder pad 102. FIG. 7 is a plan view of just the high melting temperature lead free solder pad 102 having the pattern of dimples 108 on the top 110 of the high melting temperature lead free solder pad 102.

The lead free solder ball is placed in direct contact with the pattern of dimples in the high melting temperature lead free solder pad, box 88 (FIG. 5) and then the lead free solder ball and the high melting temperature lead free solder pad are heated to about 240 to 260° C. to cause the lead free solder ball and the high melting temperature lead free solder pad to join, box 90 (FIG. 5).

Figure 6D:
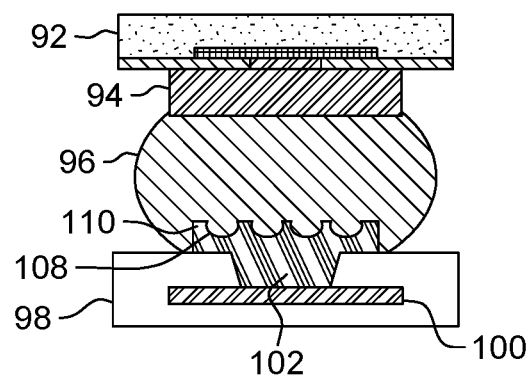

Referring now to FIG. 6D, the lead free solder ball 96 is placed in direct contact with the pattern of dimples 108 in the high melting temperature lead free solder pad 102. Then the lead free solder ball 96 and the high melting temperature lead free solder pad 102 are heated to about 250° C. to cause the lead free solder ball 96 and the high melting temperature lead free solder pad 102 to join.

In one exemplary embodiment, the first substrate is a first level package such as a CSP and the second substrate is an organic laminate daughter card.

In another exemplary embodiment, the first substrate is an organic laminate daughter card and the second substrate is an organic laminate mother card.

The exemplary embodiments produce a structure within the joint of high melt solder that keeps an ideal shape to spread current on the ground side of the laminate.

It is the copper/solder interface that leads to electromigration fails. The exemplary embodiments move and spread the current from the laminate to the interior of the joint away from the copper/solder interface. The movement of the interface reduces the localized current density.

FIG. 6D illustrates a semiconductor structure which may include a first substrate 92, a second substrate 98 having UBM 100, a lead free solder ball 96 on the first substrate and a high melting temperature lead free solder pad 102 on the UBM 100 on the second substrate 98 that joins the lead free solder ball 96 to the second substrate 98. The lead free solder ball 96 has a liquidus temperature less than 230° C. The high melting temperature lead free solder pad 102 has a liquidus temperature of about 250 to 295° C.

The high melting temperature lead free solder pad 102 has a pattern of dimples 108 on a top surface 110 of the high melting temperature lead free solder pad 102 that make direct contact with the lead free solder ball 96.

Figure 8A:
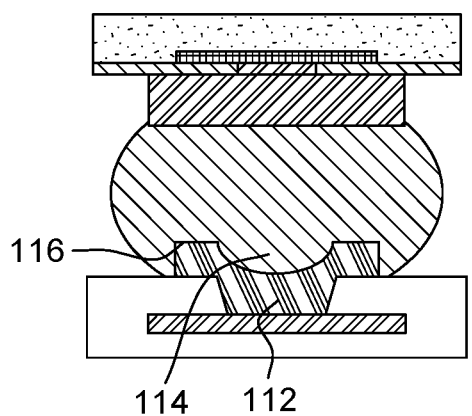
FIG. 8A is a side cross sectional view of another exemplary embodiment of the dimples in the high melting temperature lead free solder pad as a result of coining and FIG. 8B is a plan view of the dimples in FIG. 8A.
Figure 8B:
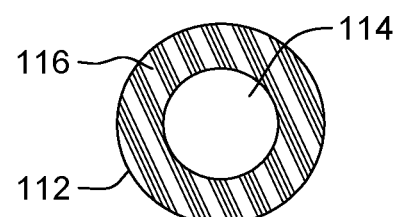

Referring now to FIGS. 8A and 8B, there is illustrated another exemplary embodiment of a pattern of dimples 114 on a top surface 116 of a high melting temperature lead free solder pad 112. In this exemplary embodiment, there is one dimple 114 in the approximate center of the high melting temperature lead free solder pad 112.

Figure 9A:
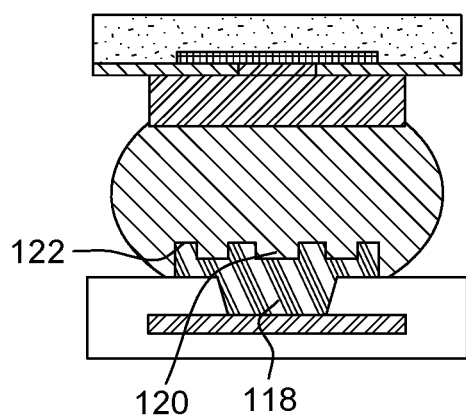
FIG. 9A is a side cross sectional view of a further exemplary embodiment of the dimples in the high melting temperature lead free solder pad as a result of coining and FIG. 9B is a plan view of the dimples in FIG. 9A.
Figure 9B:
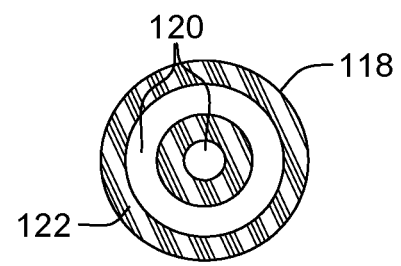

Referring now to FIGS. 9A and 9B, there is illustrated another exemplary embodiment of a pattern of dimples 120 on a top surface 122 of a high melting temperature lead free solder pad 118. In this exemplary embodiment, there are concentric rings 120 of dimples arranged around the approximate center of the high melting temperature lead free solder pad 118.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of joining a semiconductor structure comprising:
    forming a first low melting temperature lead free solder having a liquidus temperature less than 230° C. on a first substrate;
    placing a lead free ball comprising copper and tin having a liquidus temperature greater than 250° C. on the first low melting temperature lead free solder;
    reflowing the first low melting temperature lead free solder at a temperature lower than the liquidus temperature of the lead free ball;
    annealing at a temperature of 140 to 165° C. to convert the first low melting temperature lead free solder into a higher melting temperature lead free solder having a liquidus temperature of 240 to 250° C.;
    placing a second low melting temperature lead free solder having a liquidus temperature of 220° C. or less on a second substrate;
    placing the lead free ball in direct contact with the second low melting temperature lead free solder; and
    heating at 240 to 260° C. the semiconductor structure to cause the second low melting temperature lead free solder to reflow and join with the lead free ball.

2. The method of claim 1 wherein the first low melting temperature lead free solder and the second low melting temperature lead free solder each comprise an alloy of tin, silver and copper.

3. The method of claim 1 wherein the lead free ball has a liquidus temperature of 250-280 C.

4. The method of claim 1 wherein the lead free ball is an alloy comprising tin/silver/nickel/copper/gold having the composition, in weight percent, of 0.01 to 6% copper, 0.01 to 4% silver, 0.01 to 1% gold, 0.01 to 2% nickel, remainder tin.

5. The method of claim 1 wherein the lead free ball is an alloy comprising copper and tin having the composition Cu6Sn5 or Cu3Sn.

6. The method of claim 1 wherein the first substrate is a first level package and the second substrate is an organic laminate daughter card.

7. The method of claim 1 wherein the first substrate is an organic laminate daughter card and the second substrate is a first level package.

8. The method of claim 1 wherein the first substrate is an organic laminate daughter card and the second substrate is an organic laminate mother card.

9. The method of claim 1 wherein the first substrate is an organic laminate mother card and the second substrate is an organic laminate daughter card.

10. A semiconductor structure comprising:
a first substrate;
a second substrate;
a lead free ball comprising copper and tin having a liquidus temperature greater than 250° C. interposed between the first and second substrates, wherein the lead free ball is an alloy comprising tin/silver/nickel/copper/gold having the composition, in weight percent, of 0.01 to 6% copper, 0.01 to 4% silver, 0.01 to 1% gold, 0.01 to 2% nickel, remainder tin;
a high melt lead free, all metal solder joining the lead free ball to the first substrate, the high melt lead free solder having a liquidus temperature at least 10° C. less than the liquidus temperature of the lead free ball; and
a low melt lead free, all metal solder joining the lead free ball to the second substrate, the low melt lead free solder having a liquidus temperature of 220° C. or less.

11. The semiconductor structure of claim 10 wherein the high melt lead free, all metal solder and the low melt lead free, all metal solder each comprise an alloy of tin, silver and copper.

12. The semiconductor structure of claim 10 wherein the lead free ball has a liquidus temperature of 250-280 C.

13. The semiconductor structure of claim 10 wherein the first substrate is an organic laminate daughter card and the second substrate is an organic laminate mother card.

14. The semiconductor structure of claim 10 wherein the first substrate is an organic laminate mother card and the second substrate is an organic laminate daughter card.

15. A semiconductor structure comprising:
a first substrate;
a second substrate;
a lead free ball comprising copper and tin having a liquidus temperature greater than 250° C. interposed between the first and second substrates, wherein the lead free ball is an alloy comprising copper and tin having the composition Cu6Sn5 or Cu3Sn;
a high melt lead free, all metal solder joining the lead free ball to the first substrate, the high melt lead free solder having a liquidus temperature at least 10° C. less than the liquidus temperature of the lead free ball; and
a low melt lead free, all metal solder joining the lead free ball to the second substrate, the low melt lead free solder having a liquidus temperature of 220° C. or less.

16. The semiconductor structure of claim 15 wherein the high melt lead free, all metal solder and the low melt lead free, all metal solder each comprise an alloy of tin, silver and copper.

17. The semiconductor structure of claim 15 wherein the lead free ball has a liquidus temperature of 250-280 C.

18. The semiconductor structure of claim 15 wherein the first substrate is an organic laminate daughter card and the second substrate is an organic laminate mother card.

19. The semiconductor structure of claim 15 wherein the first substrate is an organic laminate mother card and the second substrate is an organic laminate daughter card.

20. A semiconductor structure comprising:
a first substrate;
a second substrate;
a lead free ball comprising copper and tin having a liquidus temperature greater than 250° C. interposed between the first and second substrates;
a high melt lead free, all metal solder joining the lead free ball to the first substrate, the high melt lead free solder having a liquidus temperature at least 10° C. less than the liquidus temperature of the lead free ball; and
a low melt lead free, all metal solder joining the lead free ball to the second substrate, the low melt lead free solder having a liquidus temperature of 220° C. or less;
wherein the first substrate is a first level package and the second substrate is an organic laminate daughter card.

21. The semiconductor structure of claim 20 wherein the high melt lead free, all metal solder and the low melt lead free, all metal solder each comprise an alloy of tin, silver and copper.

22. The semiconductor structure of claim 20 wherein the lead free ball has a liquidus temperature of 250-280 C.

23. A semiconductor structure comprising:
a first substrate;
a second substrate;
a lead free ball comprising copper and tin having a liquidus temperature greater than 250° C. interposed between the first and second substrates;
a high melt lead free, all metal solder joining the lead free ball to the first substrate, the high melt lead free solder having a liquidus temperature at least 10° C. less than the liquidus temperature of the lead free ball; and
a low melt lead free, all metal solder joining the lead free ball to the second substrate, the low melt lead free solder having a liquidus temperature of 220° C. or less;
wherein the first substrate is an organic laminate daughter card and the second substrate is a first level package.

24. The semiconductor structure of claim 23 wherein the high melt lead free, all metal solder and the low melt lead free, all metal solder each comprise an alloy of tin, silver and copper.

25. The semiconductor structure of claim 23 wherein the lead free ball has a liquidus temperature of 250-280 C.

* * * * *